(12) United States Patent
Kim et al.

(10) Patent No.: US 7,961,010 B2
(45) Date of Patent: Jun. 14, 2011

(54) DYNAMIC LOGIC CIRCUIT INCLUDING DYNAMIC STANDARD CELL LIBRARY

(75) Inventors: Tae-Hyung Kim, Hwaseong-si (KR); Minsu Kim, Hwaseong-si (KR)

(73) Assignee: Samsung Electronics Co., Ltd., Suwon-Si,. Gyeonggi-do (KR)

( * ) Notice: Subject to any disclaimer, the term of this patent is extended or adjusted under 35 U.S.C. 154(b) by 0 days.

(21) Appl. No.: 12/652,415

(22) Filed: Jan. 5, 2010

(65) Prior Publication Data

US 2010/0182047 A1    Jul. 22, 2010

(30) Foreign Application Priority Data

Jan. 19, 2009    (KR) .................... 10-2009-0004236

(51) Int. Cl.
   *H03K 19/00* (2006.01)
   *H03K 19/096* (2006.01)
(52) U.S. Cl. .................... 326/103; 326/95; 326/98
(58) Field of Classification Search .............. 326/95–98, 326/103, 112, 119, 121; 257/204
See application file for complete search history.

(56) References Cited

U.S. PATENT DOCUMENTS

| | | | |
|---|---|---|---|
| 5,612,638 A * | 3/1997 | Lev | 326/98 |
| 5,814,846 A | 9/1998 | Essbaum et al. | |
| 5,821,778 A * | 10/1998 | Bosshart | 326/95 |
| 2002/0097068 A1 | 7/2002 | Morgan | |
| 2003/0117173 A1 | 6/2003 | Morgan | |
| 2006/0131609 A1 | 6/2006 | Kinoshita et al. | |
| 2006/0138464 A1 | 6/2006 | Shimamura | |
| 2007/0004147 A1 | 1/2007 | Toubou et al. | |
| 2008/0106311 A1 | 5/2008 | Do | |

FOREIGN PATENT DOCUMENTS

| | | |
|---|---|---|
| JP | 2006-173478 | 6/2006 |
| JP | 2006-196872 | 7/2006 |
| JP | 2007-012855 | 1/2007 |
| KR | 1998-032570 | 7/1998 |
| KR | 1020070036625 | 4/2007 |
| KR | 1020080021393 | 3/2008 |
| KR | 1020080040557 | 5/2008 |

OTHER PUBLICATIONS

English Abstract for Publication No. 1998-032570.
English Abstract for Publication No. 2006-173478.
English Abstract for Publication No. 2006-196872.
English Abstract for Publication No. 2007-012855.
English Abstract for Publication No. 1020070036625.
English Abstract for Publication No. 1020080021393.
English Abstract for Publication No. 1020080040557.

* cited by examiner

*Primary Examiner* — Daniel D Chang
(74) *Attorney, Agent, or Firm* — F. Chau & Associates, LLC

(57) ABSTRACT

A dynamic logic circuit includes a first region including a plurality of PMOS transistors and a second region, adjacent to the first region, including a plurality of NMOS transistors connected with at least one of the plurality of PMOS transistors. Channel sizes of the plurality of NMOS transistors are greater than channel sizes of the plurality of PMOS transistors.

17 Claims, 18 Drawing Sheets

DYNAMIC LOGIC CIRCUIT INCLUDING DYNAMIC STANDARD CELL LIBRARY

CROSS-REFERENCE TO RELATED APPLICATIONS

This application claims priority under 35 U.S.C §119 to Korean Patent Application No. 10-2009-0004236 filed on Jan. 19, 2009, the entirety of which is hereby incorporated by reference.

BACKGROUND

The present invention relates to a dynamic standard cell. More particularly, the present invention relates to a dynamic logic circuit including a dynamic standard cell library.

In general, soft core (for example, behavioral or RTL code) may perform place and routing (P&R) using standard libraries in order to design chips. A set of conventional library cells may include basic cells such as AND, OR, NOR, INVERTER, and the like, complex cells such as OAI (OR/AND/INVERTER), AOI (AND/OR/INVERTER), and the like, and storage elements such as master-slave flip-flop, latch, and the like.

SUMMARY

Exemplary embodiments of the present invention are directed to provide a dynamic logic circuit capable of reducing an area of a design chip.

Exemplary embodiments of the present invention are further directed to provide an NMOS transistor having a maximum gate size while retaining the same chip area in a dynamic logic circuit.

One aspect of exemplary embodiments of the present invention is directed to provide a dynamic logic circuit which includes a first region including a plurality of PMOS transistors and a second region adjacent to the first region and including a plurality of NMOS transistors connected with at least one of the plurality of PMOS transistors. The channel sizes of the plurality of NMOS transistors are greater than the channel sizes of the plurality of PMOS transistors.

BRIEF DESCRIPTION OF THE FIGURES

Non-limiting and non-exhaustive embodiments will be described with reference to the following figures, wherein like reference numerals may refer to like parts throughout the various figures unless otherwise specified. In the figures.

DETAILED DESCRIPTION OF EXEMPLARY EMBODIMENTS

Below, exemplary embodiments of the present invention will be more fully described with reference to the accompanying drawings.

Figure 1:
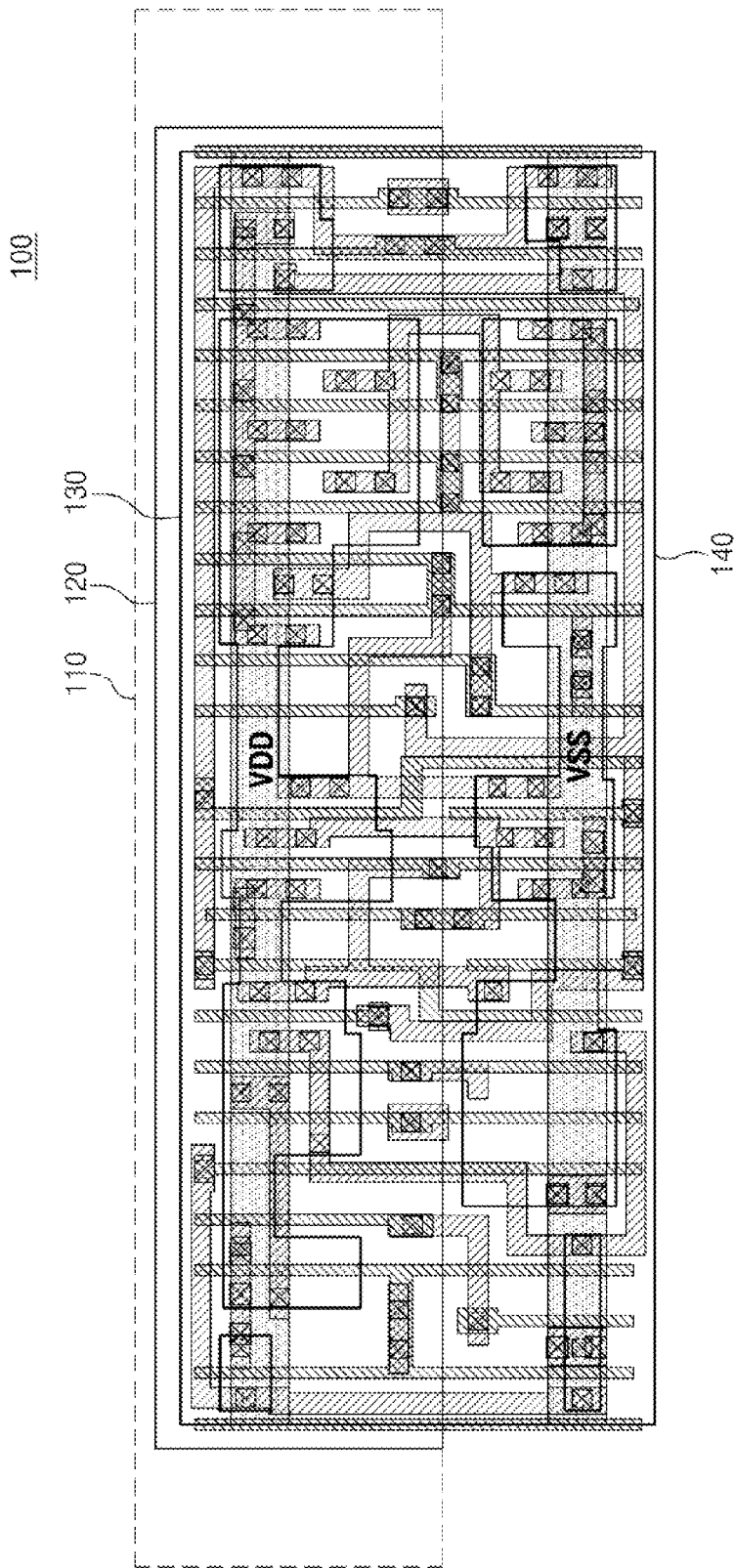
FIG. 1 is a diagram showing a circuit using a common platform library.

FIG. 1 is a layout diagram showing a circuit to which the common platform library is adopted.

As illustrated in FIG. 1, the common platform library 100 may include an N-well region 110, a boron monophosphide (BP) layer 120, a PMOS region 130, and an NMOS region 140. The N-well region 110 may be a region where a substrate of a PMOS transistor is formed. The BP layer 120 may be a region masked to form a PMOS transistor. A plurality of PMOS transistors may be formed at the PMOS region 130 and the NMOS region 140 may be a P-well region where a substrate of an NMOS transistor is formed.

Since a current driving capacity of a PMOS transistor is less than that of an NMOS transistor, an area of the PMOS region 130 may be greater than that of the NMOS region 140. For example, a layout size of a PMOS transistor may be about 1.5 times greater than that of an NMOS transistor.

In cases where a static logic design is used, a ratio of PMOS transistors to NMOS transistors may be about 1:1. Thus, the static logic may mainly use the common platform library.

As a design method of a digital circuit, dynamic logic may be characterized in that there is executed a rapid operation via a PMOS transistor which performs a pre-charge operation according to the control of a clock signal. Dynamic logic may be formed of a plurality of PMOS transistors for pre-charge and a plurality of NMOS transistors for basic logic circuits. In cases where a dynamic logic circuit is designed, the number of PMOS transistors may be less than that of NMOS transistors.

If the common platform library is applied to the dynamic logic circuit, a significant portion of the area of a chip designed by the dynamic logic circuit may be dedicated to overhead.

Figure 2:
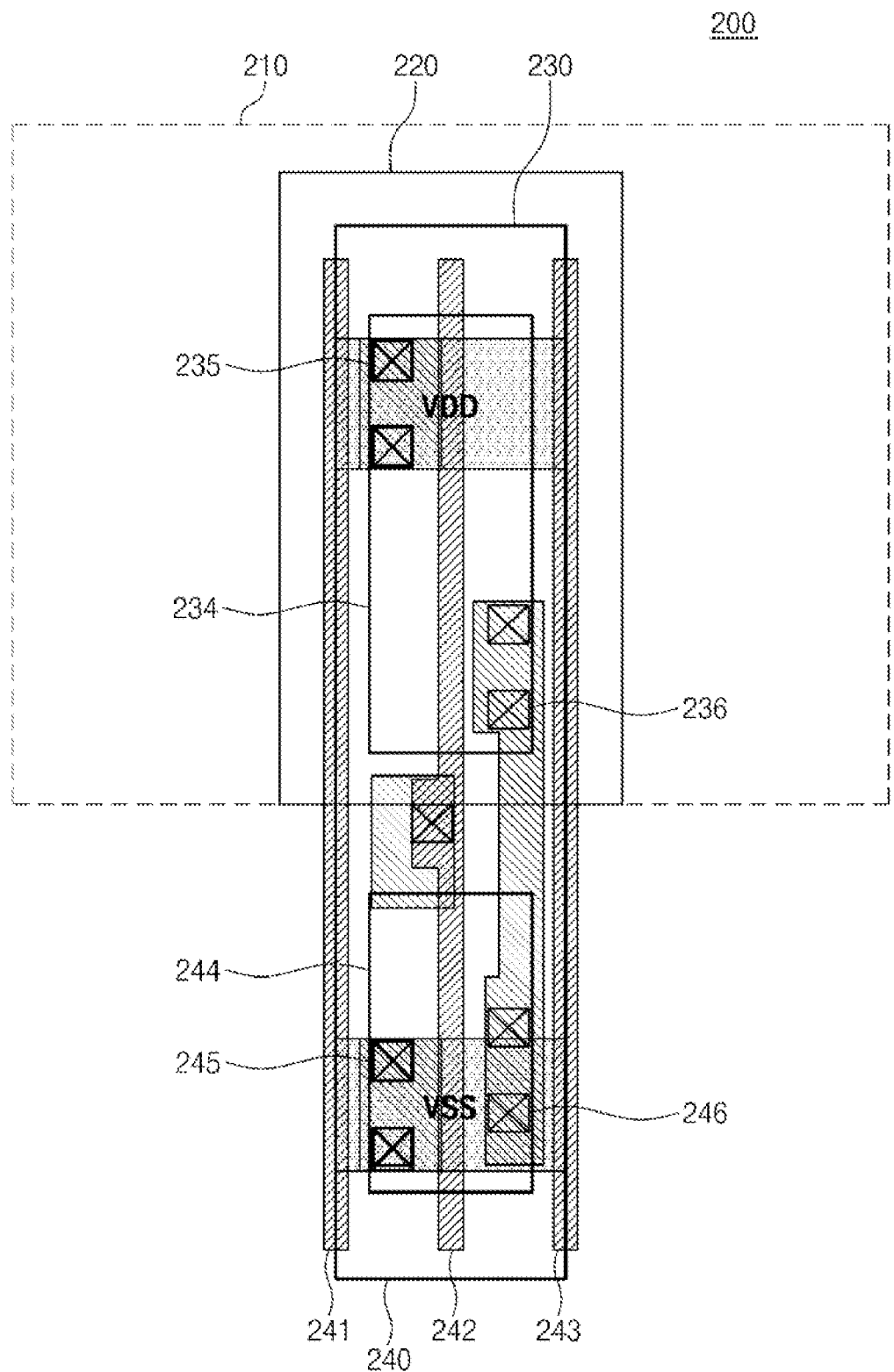
FIG. 2 is a layout diagram showing an inverter according to the common platform library illustrated in FIG. 1.

FIG. 2 is a layout diagram showing an inverter according to the common platform library.

Referring to FIG. 2, an inverter 200 according to the common platform library may include an N-well region 210, a BP layer 220, a PMOS region 230, and an NMOS region 240.

The PMOS region 230 may be included within the N-well region 210 and a PMOS transistor may be formed within the PMOS region 230. The NMOS region 240 may be a P-well region and an NMOS transistor may be formed within the NMOS region 240. For example, the PMOS region 230 may include one PMOS transistor, and the NMOS region 240 may include one NMOS transistor.

The first and third gates 241 and 243 may be dummy gates which are added according to the layout design rule. The second gate 242 may connect a gate terminal of a PMOS transistor of the PMOS region 230 with a gate terminal of an NMOS transistor of the NMOS region 240. An NMOS active region 244 may be an active region of an NMOS transistor, and a PMOS active region 234 may be an active region of a PMOS transistor.

The NMOS transistor may include a source terminal 245 and a drain terminal 246. A source terminal 235 of the PMOS transistor may be connected with a metal line having a power supply voltage VDD, through a via. The source terminal 245 of the NMOS transistor may be connected with a metal line having a ground voltage VSS, through a via. A drain terminal 236 of the PMOS transistor may be connected with the drain terminal 246 of the NMOS transistor and with a metal line through a via. The via(s) may connect each terminal of a transistor with a metal line.

Figure 3:
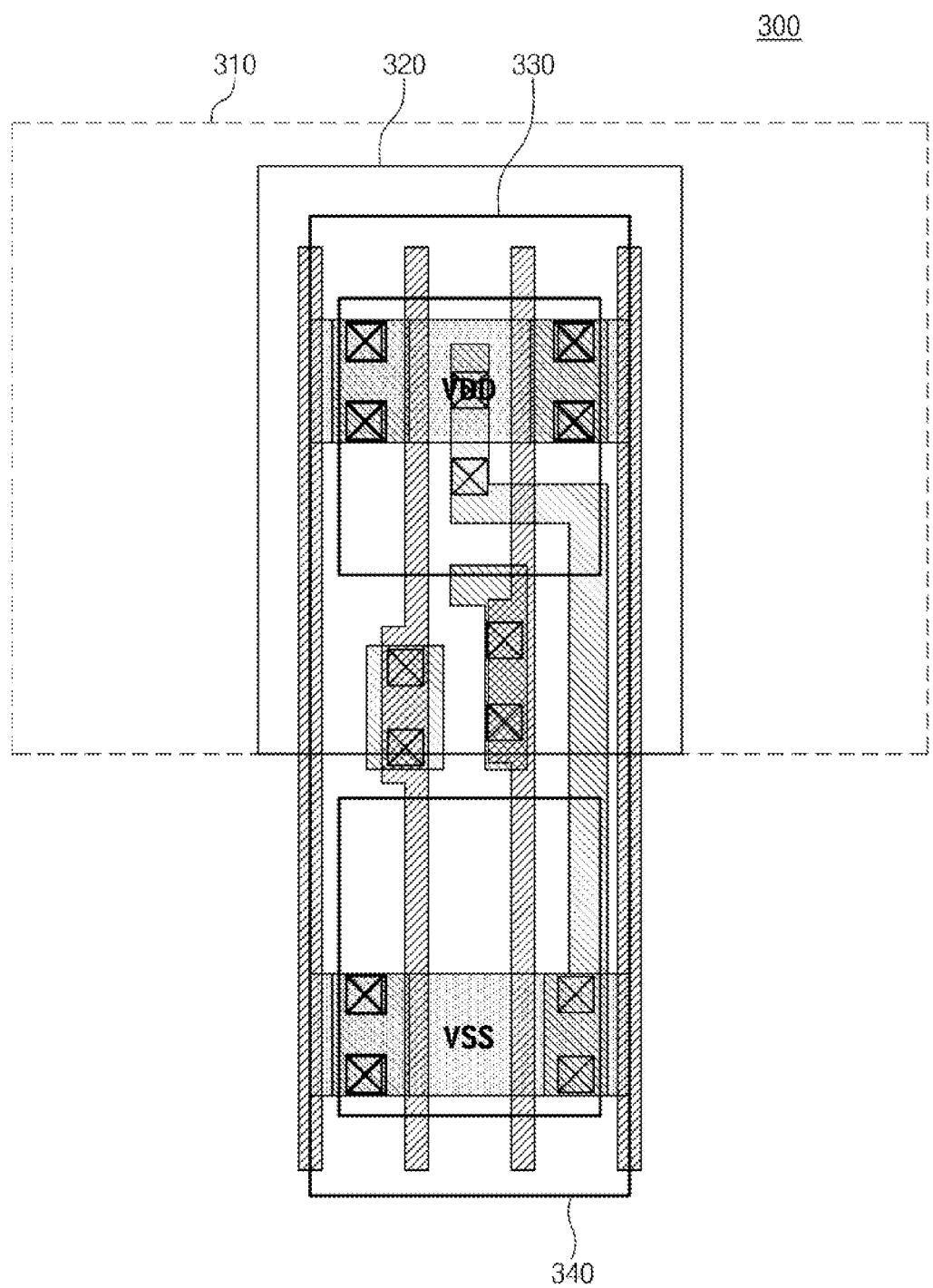
FIG. 3 is a layout diagram showing a NAND gate according to the common platform library illustrated in FIG. 1.

FIG. 3 is a layout diagram showing a NAND gate according to the common platform library illustrated in FIG. 1. Referring to FIG. 3, a NAND gate 300 according to the common platform library may include an N-well region 310, a BP layer 320, a PMOS region 330, and an NMOS region 340. A layout diagram in FIG. 3 is similar to a layout diagram of an inverter illustrated in FIG. 2 except that the PMOS region 330 includes two PMOS transistors and the NMOS region 340 includes two NMOS transistors.

Figure 4:
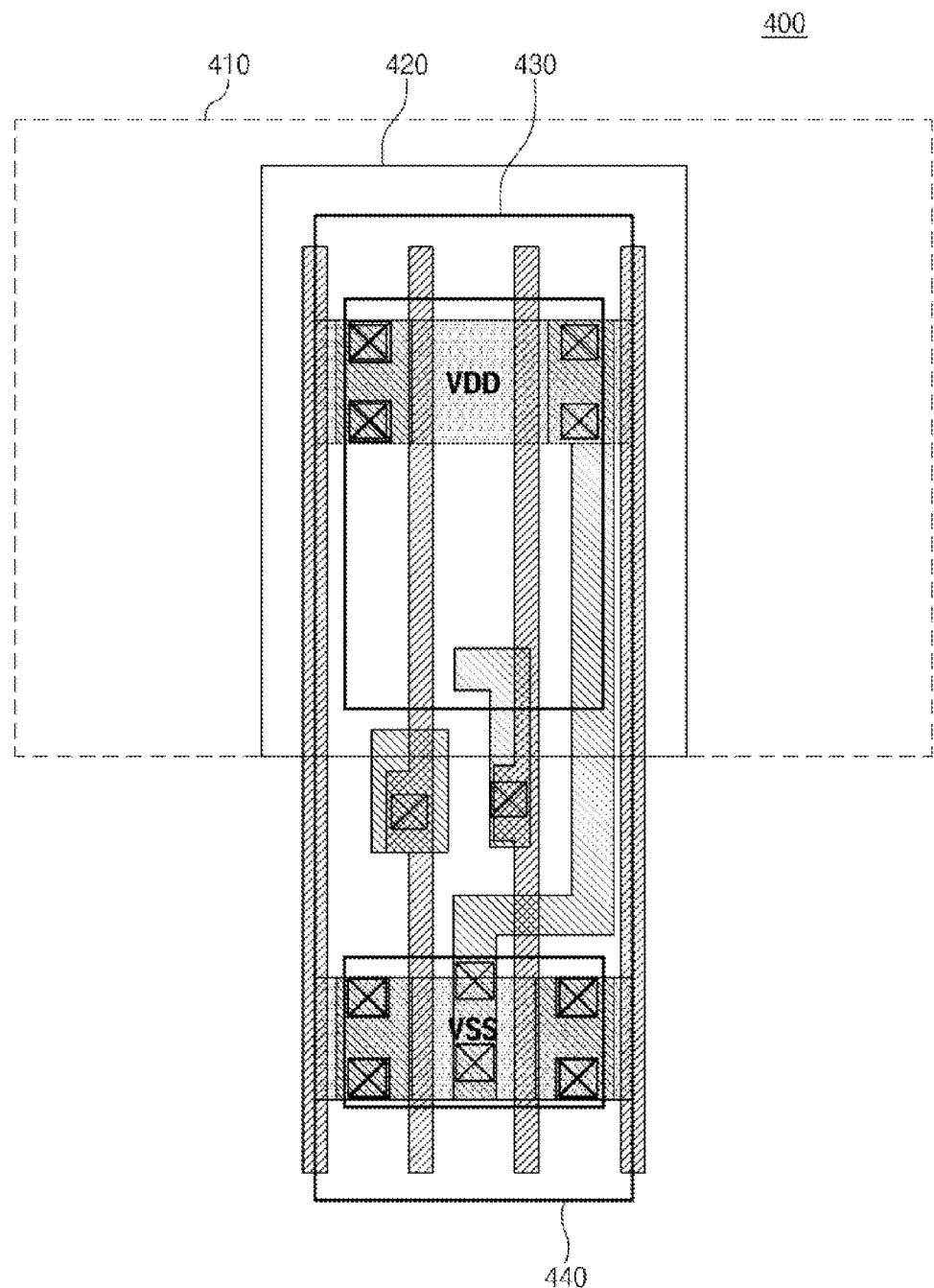
FIG. 4 is a layout diagram showing a NOR gate according to the common platform library illustrated in FIG. 1.

FIG. 4 is a layout diagram showing a NOR gate according to the common platform library illustrated in FIG. 1. Referring to FIG. 4, a NOR gate 400 according to the common platform library may include an N-well region 410, a BP layer 420, a PMOS region 430, and an NMOS region 440. A layout diagram in FIG. 4 is similar to a layout diagram of an inverter illustrated in FIG. 2 except that the PMOS region 430 includes two PMOS transistors and the NMOS region 440 includes two NMOS transistors.

Each of the NAND and NOR gates 300 and 400 according to the common platform library illustrated in FIGS. 3 and 4 may include a wide N-well region. A gate size of a PMOS transistor may be more than that of an NMOS transistor.

Figure 5:
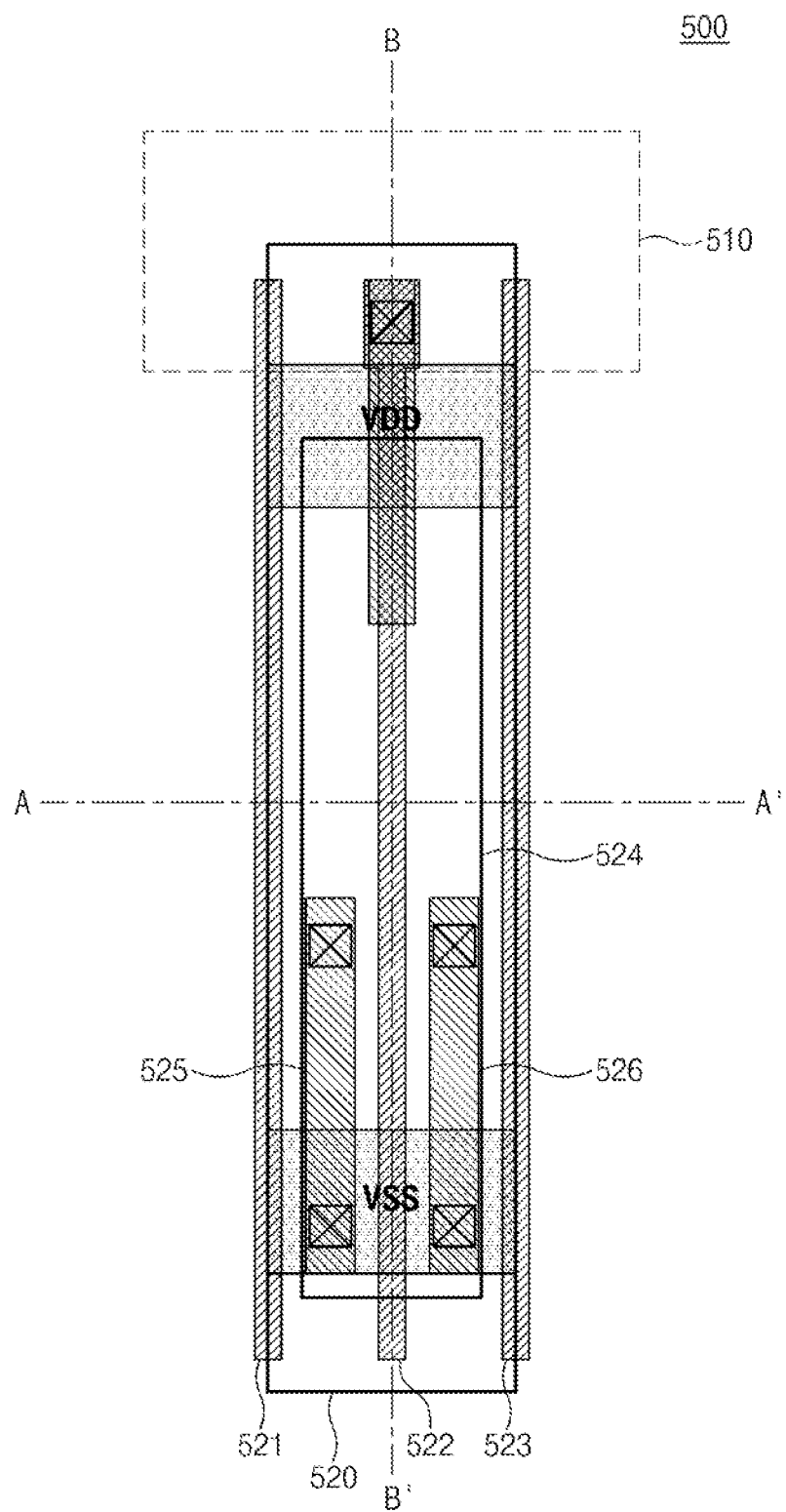
FIG. 5 is a layout diagram showing an NMOS transistor suitable for dynamic logic according to an exemplary embodiment of the present invention.
Figure 6:
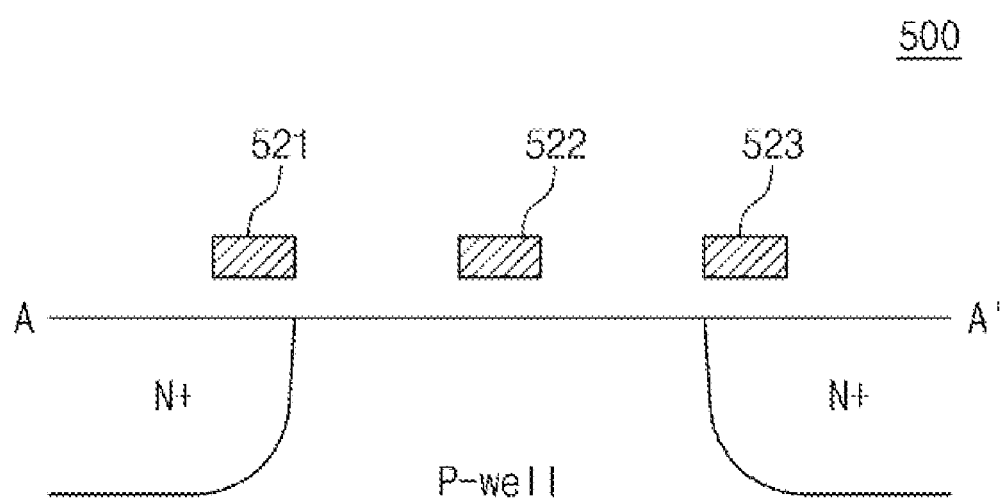
FIG. 6 is a cross-sectional view taken along a line A-A' shown in FIG. 5.
Figure 7:
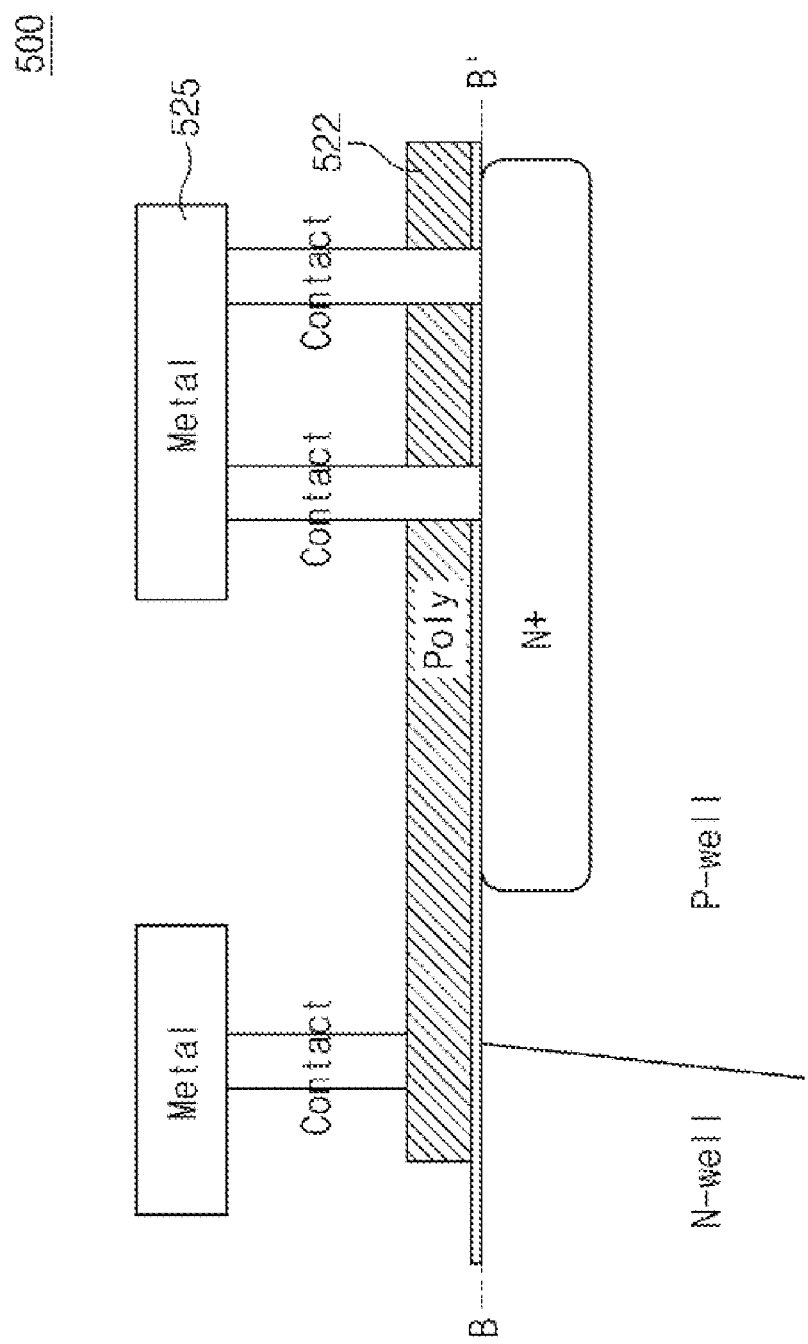
FIG. 7 is a cross-sectional view taken along a line B-B' shown in FIG. 5.

FIG. 5 is a layout diagram showing an NMOS transistor suitable for dynamic logic according to an exemplary embodiment of the present invention. FIG. 6 is a cross-sectional view taken along a line A-A' shown in FIG. 5. FIG. 7 is a cross-sectional view taken along a line B-B' shown in FIG. 5.

Referring to FIGS. 5 to 7, an NMOS transistor 500 according to an exemplary embodiment of the present invention may include an N-well region 510 and a P-well region 520. An NMOS transistor may be formed at the P-well region 520.

The N-well region 510 may be a region which is added to satisfy the layout design rule. In accordance with the layout design rule, multiple N-well regions 510 may be spaced apart from each other by the minimum margin or may be connected with each other. This will be more fully described with reference to FIG. 8.

The P-well region 520 may include one NMOS transistor. The first and third gates 521 and 523 may be dummy gates which are added to satisfy the layout design rule. The second gate 522 may be a gate of an NMOS transistor according to an exemplary embodiment of the present invention. An NMOS active region 524 may be an active region of the NMOS transistor. Further, the NMOS transistor may include a source terminal 525 and a drain terminal 526. The source and drain terminals 525 and 526 may be connected with metal lines through one or more vias.

Referring to the inverter 200 illustrated in FIG. 2, as described above, the inverter 200 may include an N-well region 210, a BP layer 220, a PMOS region 230, and an NMOS region 240. On the other hand, the NMOS transistor 500 may not include a BP layer and a PMOS region. For example, the NMOS transistor 500 may be formed even at the BP layer and the PMOS region to increase its channel size.

In case of the dynamic logic circuit, since the number of NMOS transistors is greater than the number of PMOS transistors, NMOS transistors may be formed even at a region where PMOS transistors are formed and gate sizes of NMOS transistors may be increased.

Figure 8:
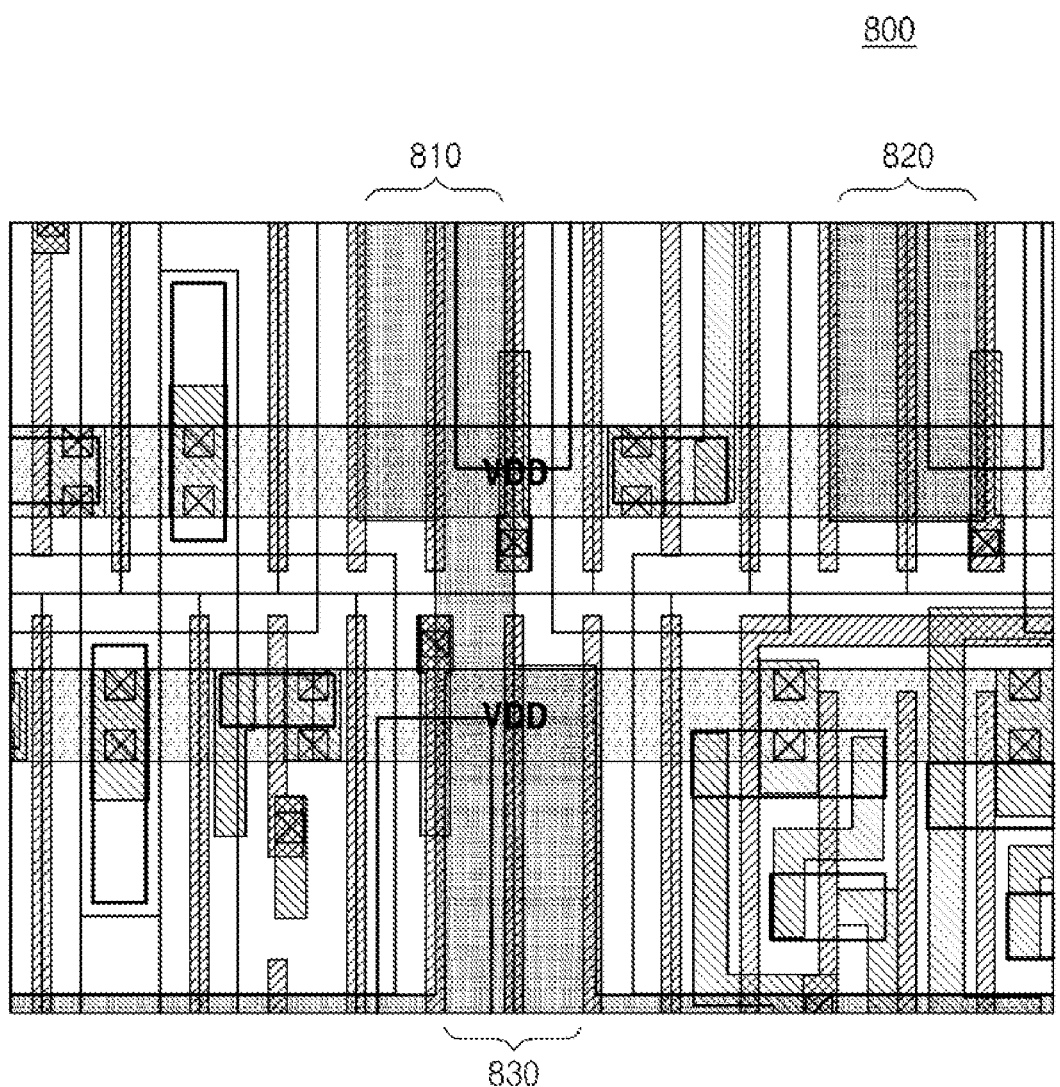
FIG. 8 is a layout diagram showing a layout design rule error caused by an NMOS transistor according to an exemplary embodiment of the present invention having no N-well.

FIG. 8 is a layout diagram showing a layout design rule error caused by an NMOS transistor according to an exemplary embodiment of the present invention not having an N-well.

According to exemplary embodiments of the present invention, a BP layer and a PMOS transistor that would otherwise be formed at a region for forming a PMOS transistor may be removed to increase a gate size of an NMOS transistor and minimize a size of an N-well region.

In accordance with an exemplary embodiment of the present invention, as illustrated in FIG. 8, the layout design rule may cause an NMOS transistor according to an exemplary embodiment of the present invention to have no N-well. For example, in accordance with the layout design rule, well regions may be spaced apart by a minimum distance from each other or connected with each other. An NMOS transistor according to an exemplary embodiment of the present invention may include a minimum N-well region to solve the layout design rule error.

A layout in FIG. 8 shows logic 800 randomly generated to include NMOS transistors having no N-well regions. Regions 810, 820, and 830 may be regions including no N-well regions. The regions 810, 820, and 830 may be connected with each other or spaced apart by a minimum distance from each other.

Figure 9:
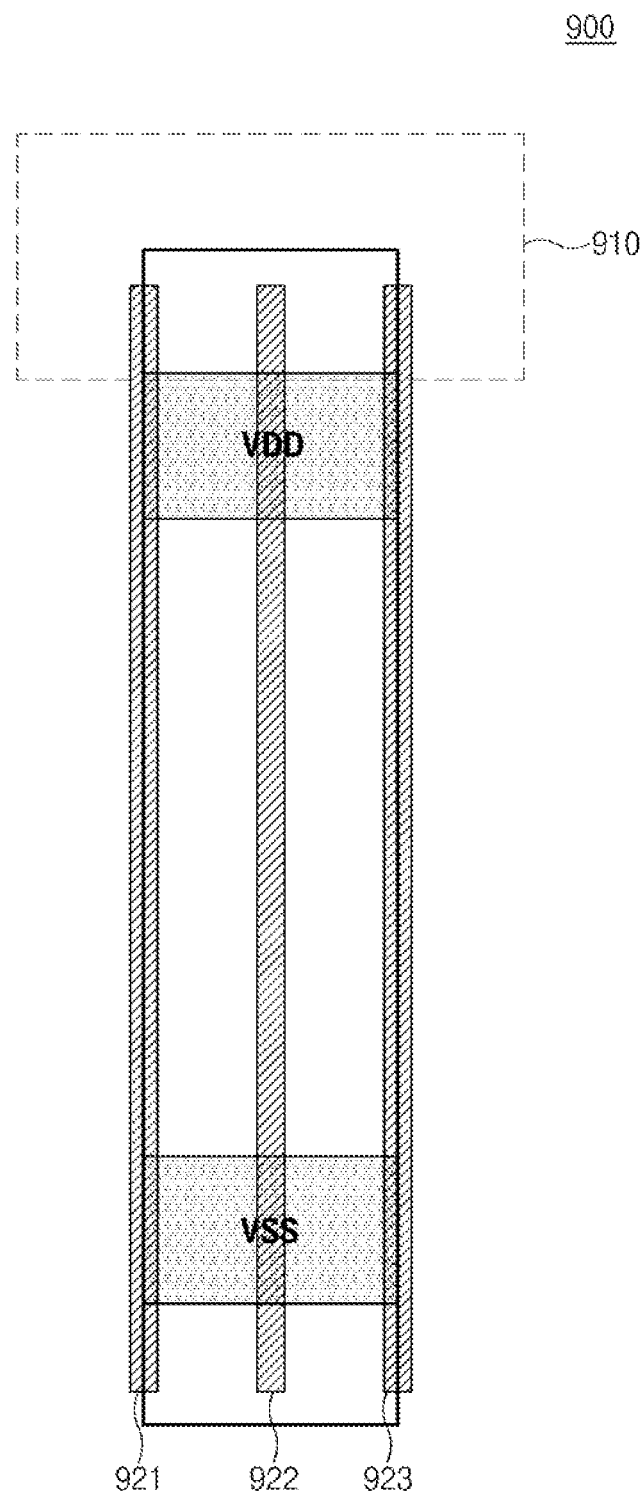
FIG. 9 is a layout diagram showing a filler cell according to an exemplary embodiment of the present invention.

FIG. 9 is a layout diagram showing a filler cell according to an exemplary embodiment of the present invention.

In the event that a cell of a common platform library format is just adjacent to an NMOS transistor cell, the layout design rule error may be caused between an N-well extended to the cell of the common platform library format and an active region of an NMOS transistor according to the present invention. That is, there may be caused the N-well to active space error. In accordance with the layout design rule, minimum margin may be secured between an N-well region and an active region.

Referring to FIG. 9, a filler cell 900 may be inserted between an NMOS transistor illustrated in FIG. 5 and a common platform library format to provide an interface.

The filler cell 900 may include a minimum N-well region 910 to prevent the N-well to active space error. Further, it is possible to minimize a width of the filler cell 900 by reducing a size of an N-well region of a common platform library cell. The filler cell 900 may further include the first to third dummy gates 921 to 923 to satisfy the layout design rule.

The filler cell 900 according to an exemplary embedment of the present invention is able to be added to solve the layout design rule error illustrated in FIG. 8.

Exemplary embodiments of the present invention may provide dynamic standard cell library by separating constituent elements of a dynamic circuit. The dynamic standard cell library according to an exemplary embodiment of the present invention may include an NMOS transistor, a PMOS transistor for pre-charge, a PMOS transistor for charge-sharing, a keeper, a latch, a pulse generator, a driver, and the like.

Exemplary layouts of the dynamic standard cell library are illustrated in FIGS. 10 to 18.

Figure 10:
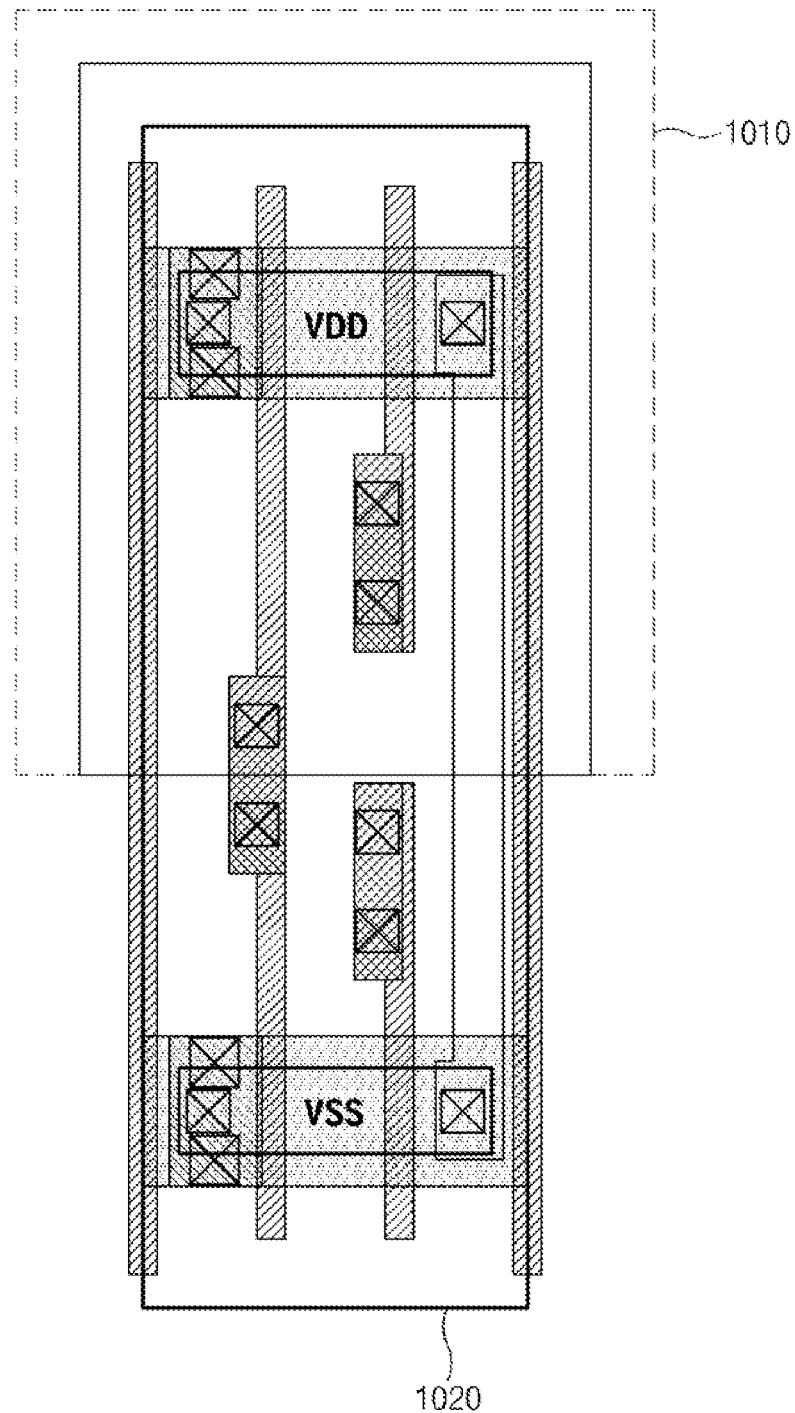
FIG. 10 is a layout diagram showing a 3-state inverter according to an exemplary embodiment of the present invention.

FIG. 10 is a layout diagram showing a 3-state inverter according to an exemplary embodiment of the present invention.

Referring to FIG. 10, a 3-state inverter 1000 may include the first and second PMOS transistors formed at an N-well region 1010 and the first and second NMOS transistors formed at a P-well region 1020. Accordingly, the first and second transistors are formed at the same active region and the first and second transistors are formed at the same active region.

Where dynamic logic is designed using a standard cell library according to an exemplary embodiment of the present invention, PMOS and NMOS transistors in the same library may include the same active region, and PMOS and NMOS transistors in different libraries may include independent active regions.

Figure 11:
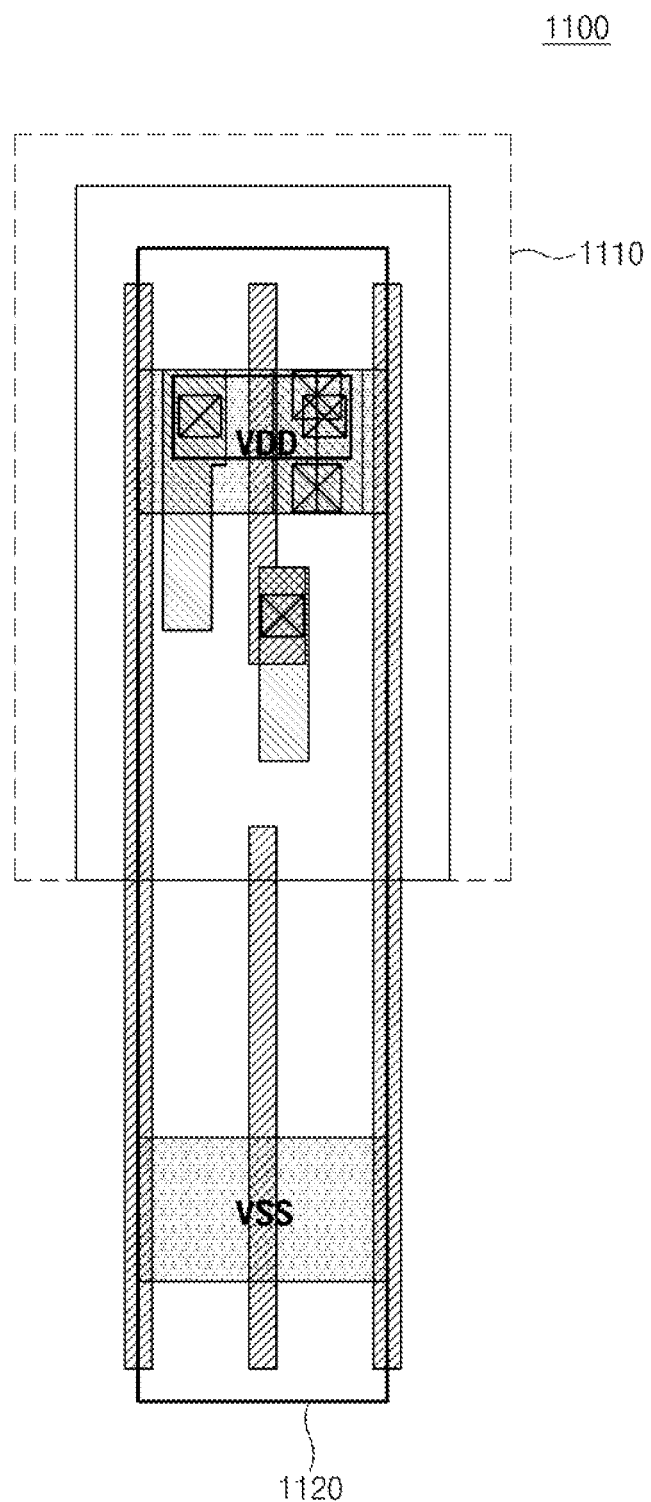
FIG. 11 is a layout diagram showing a PMOS transistor for pre-charge according to an exemplary embodiment of the present invention.

FIG. 11 is a layout diagram showing a PMOS transistor for pre-charge according to an exemplary embodiment of the present invention.

Referring to FIG. 11, a PMOS transistor 1100 for pre-charge according to an exemplary embodiment of the present invention may be formed at an N-well region 1110. Although not illustrated in FIG. 11, it is possible to form an NMOS transistor according to an exemplary embodiment of the present invention at a P-well region 1120.

Figure 12:
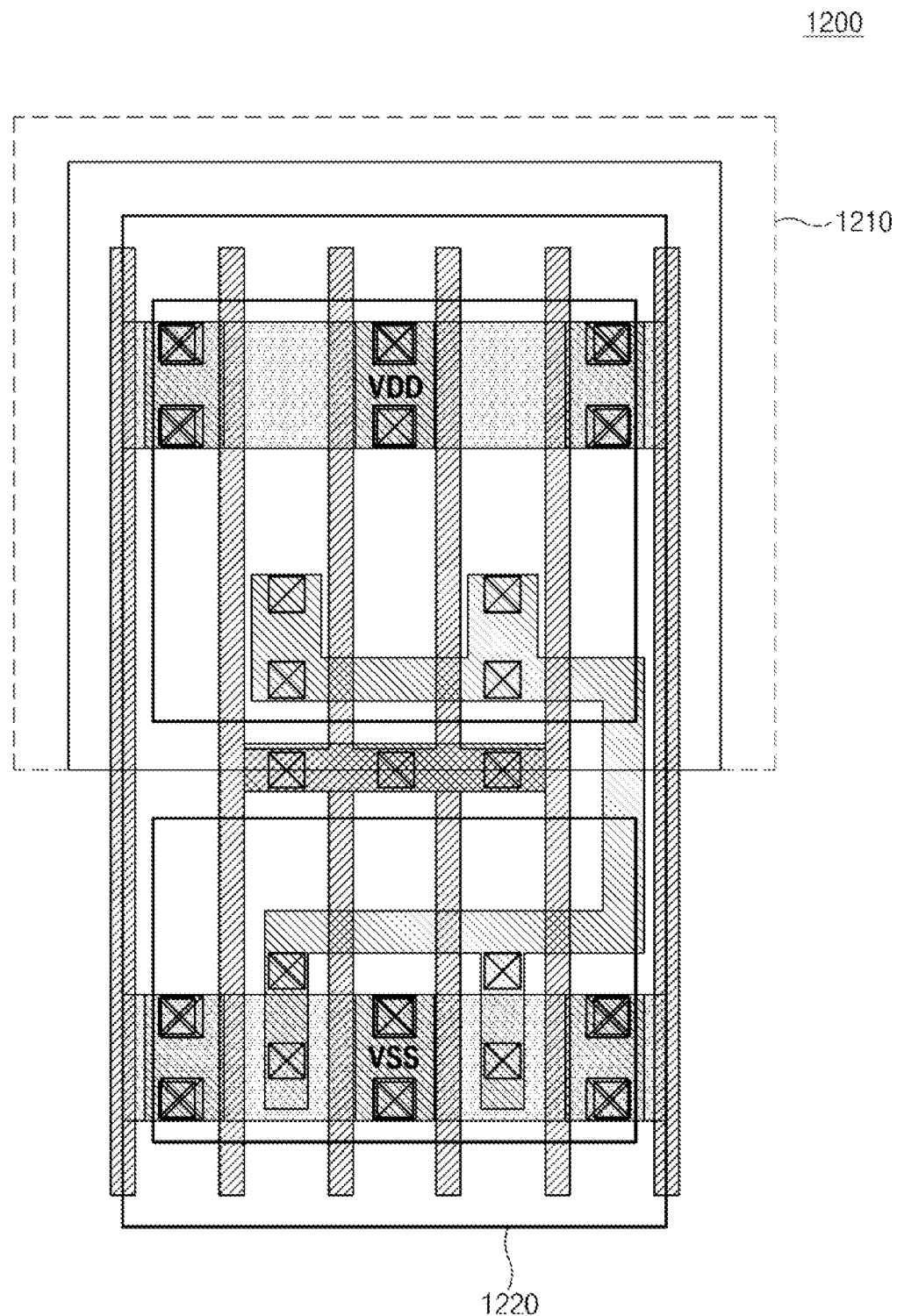
FIG. 12 is a layout diagram showing a driver according to an exemplary embodiment of the present invention.

FIG. 12 is a layout diagram showing a driver according to an exemplary embodiment of the present invention.

Referring to FIG. 12, a driver 1200 according to an exemplary embodiment of the present invention may include four PMOS transistors, which are formed at an N-well region 1210 and have the same active region, and four NMOS transistors which are formed at a P-well region 1220 and have the same active region.

Figure 13:
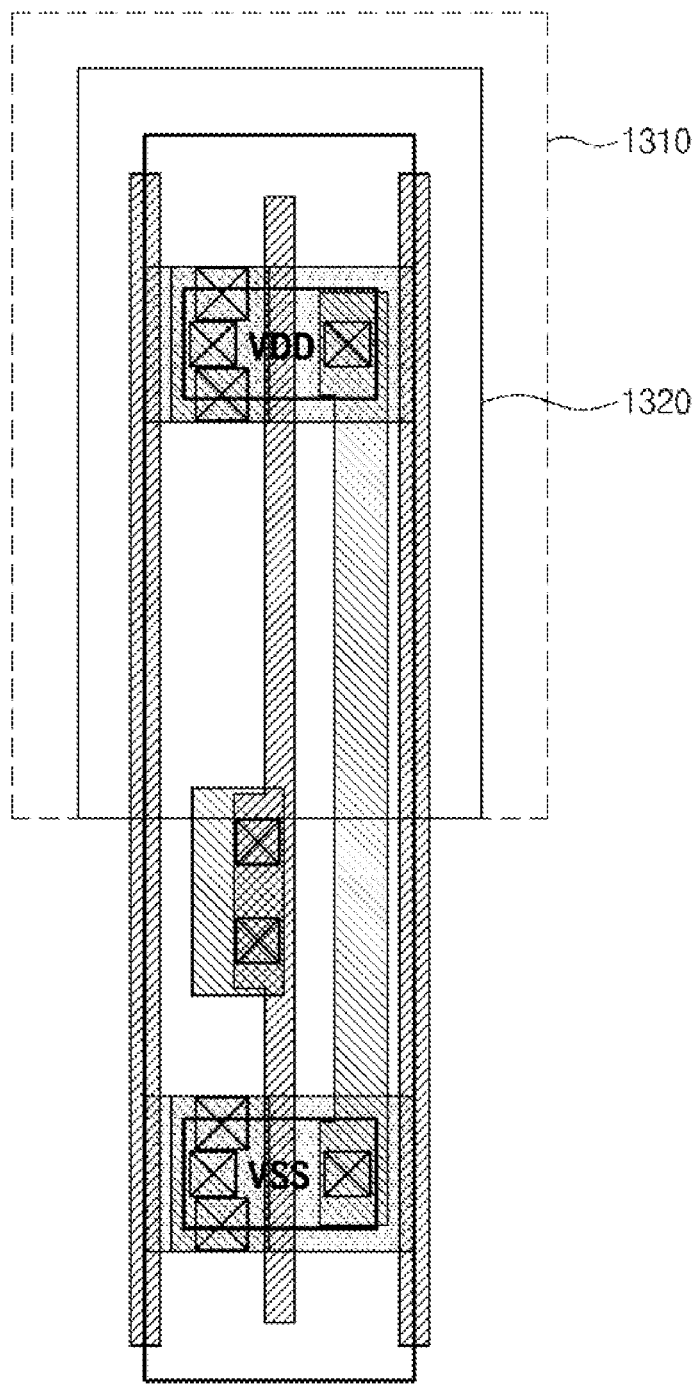
FIG. 13 is a layout diagram showing an inverter according to an exemplary embodiment of the present invention.

FIG. 13 is a layout diagram showing an inverter according to an exemplary embodiment of the present invention.

A layout in FIG. 13 is similar in structure to an inverter 200 according to the common platform library illustrated in FIG. 2. Referring to FIG. 13, an inverter 1300 according to an exemplary embodiment of the present invention may be formed such that an N-well region 1310 and a BP layer 1320 are small as compared with those of an inverter illustrated in FIG. 2.

Figure 14:
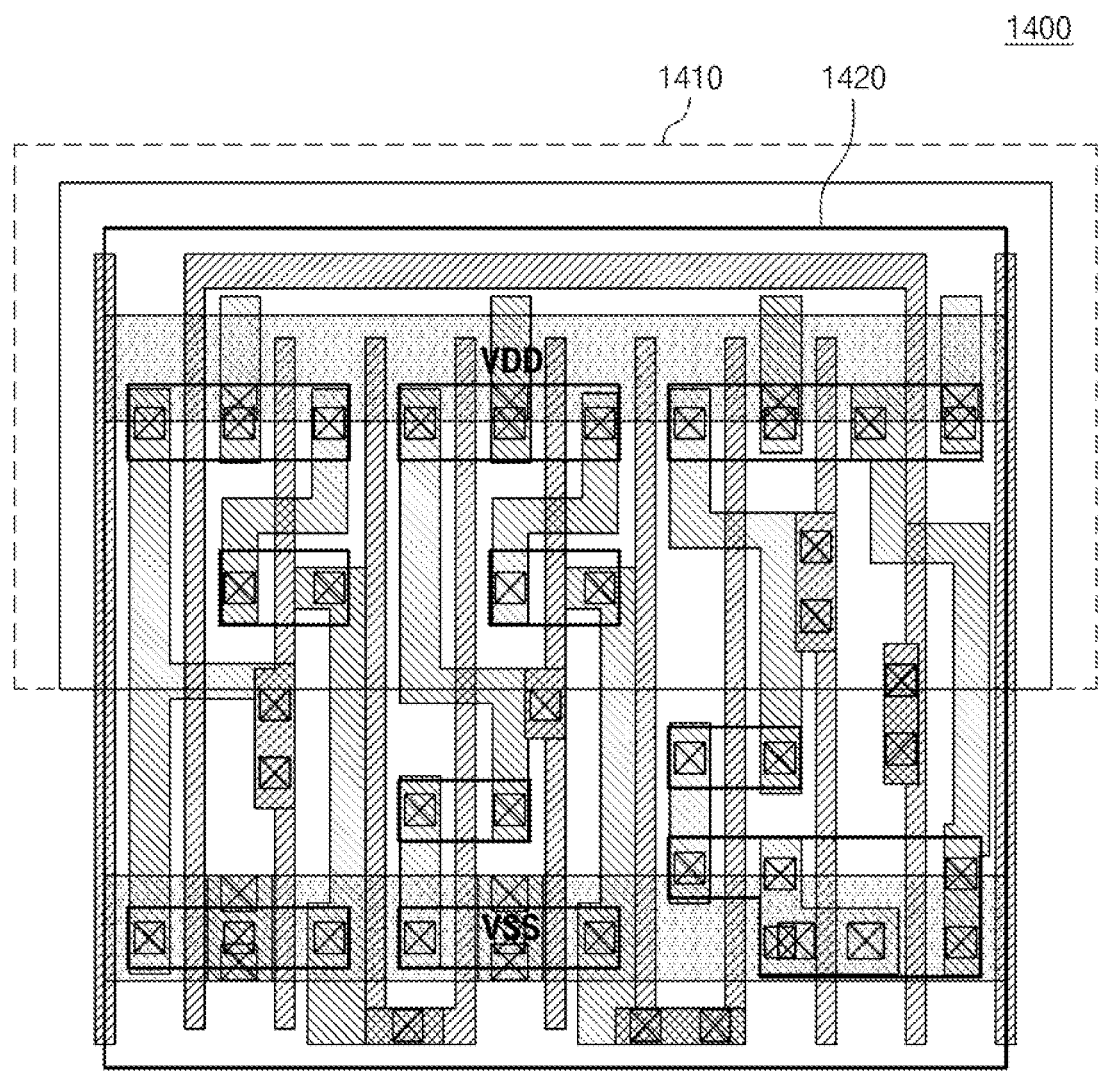
FIG. 14 is a layout diagram showing a pulse generator according to an exemplary embodiment of the present invention.

FIG. 14 is a layout diagram showing a pulse generator according to an exemplary embodiment of the present invention.

Referring to FIG. 14, a pulse generator 1400 according to an exemplary embodiment of the present invention may include an N-well region 1410 and a BP layer 1420 which are formed to have a smaller size than the corresponding N-well region 1310 and the BP layer 1320 described above with reference to FIG. 13.

Figure 15:
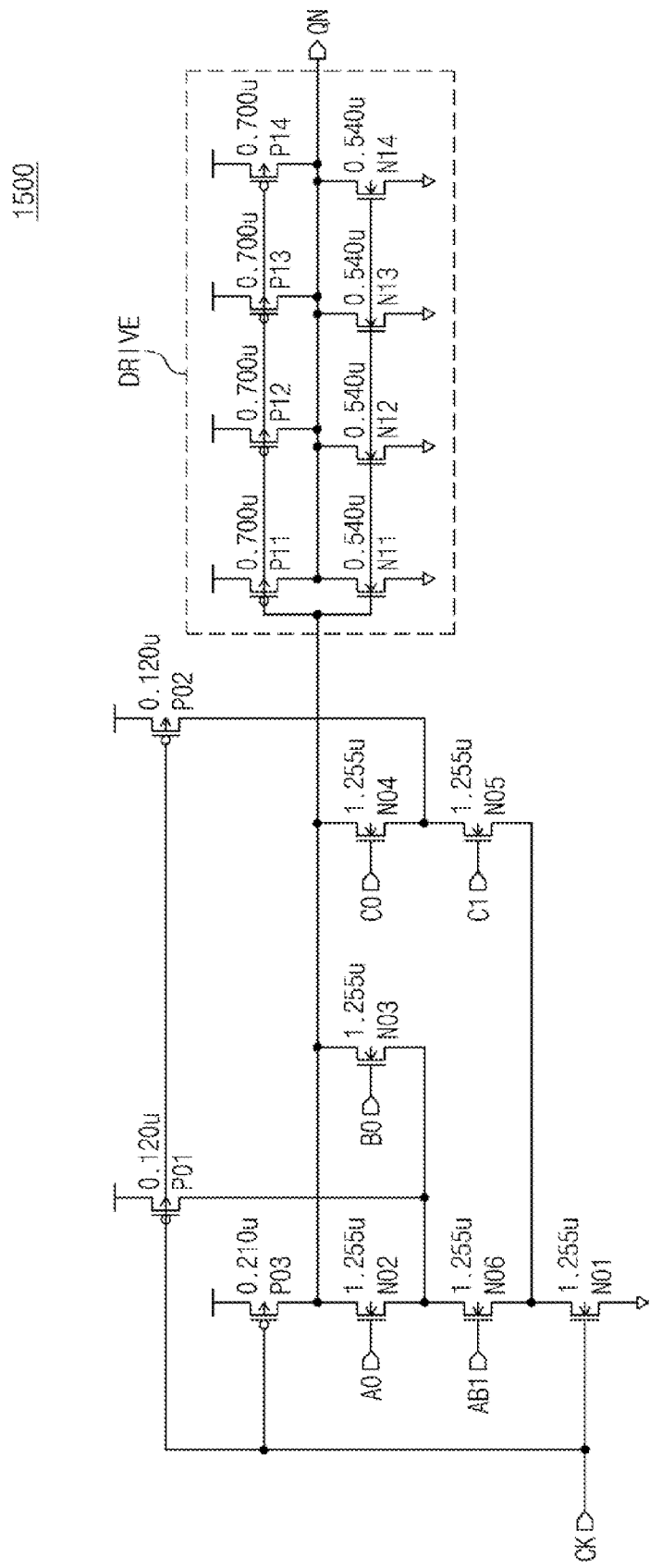
FIG. 15 is a circuit diagram showing domino logic according to an exemplary embodiment of the present invention.
Figure 16:
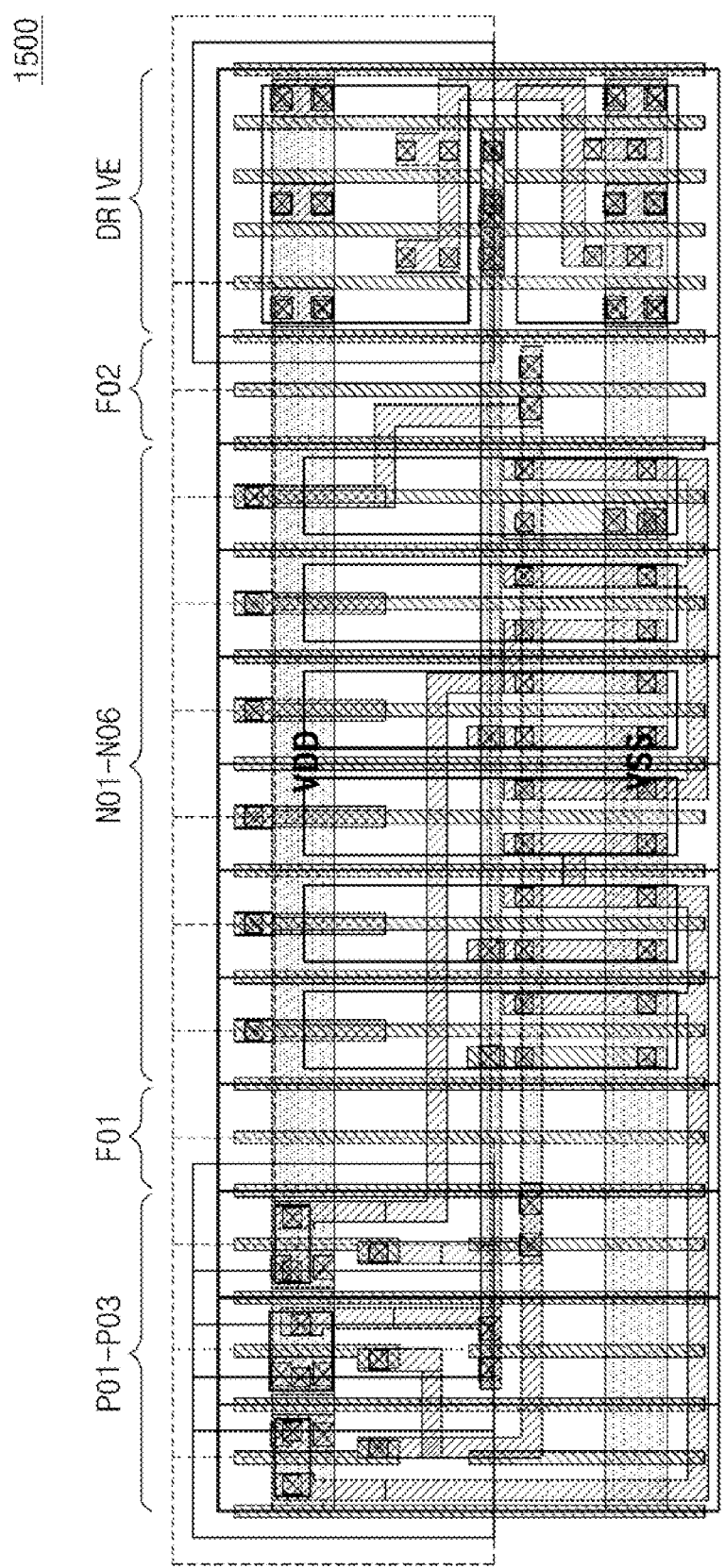
FIG. 16 is a layout diagram showing domino logic illustrated in FIG. 15.

FIG. 15 is a circuit diagram showing domino logic according to an exemplary embodiment of the present invention, and FIG. 16 is a layout diagram showing domino logic illustrated in FIG. 15.

Referring to FIG. 15, domino logic 1500 according to an exemplary embodiment of the present invention may include the first to third PMOS transistors for pre-charge P01 to P03 and the first NMOS transistor for discharge N01 controlled in common by a clock signal CK. The second to sixth NMOS transistors N02 to N06 controlled respectively by corresponding input signals, and a drive circuit DRIVE.

The drive circuit DRIVE may include additional PMOS transistors P11, P12, P13, and P14 as well as additional NMOS transistors N11, N12, N13, and N14.

A value determined via the second to sixth NMOS transistors N02 to N06 according to the input signals A0, B0, C0, C1, and AB1 may be transferred to the drive circuit DRIVE, which drives an input terminal QN in response to the received value.

Gate of the first to sixth NMOS transistors N01 to N06 may be significantly larger than the NMOS transistors in the drive circuit DRIVE. The first to sixth NMOS transistors N01 to N06 may be used as library suitable for dynamic logic according to an exemplary embodiment of the present invention.

Referring to FIGS. 15 and 16, domino logic 1500 in FIG. 16 may include the first to third PMOS transistors P01 to P03, the first to sixth NMOS transistors N01 to N06 including independent active regions, the first and second filler cells F01 and F02, and a drive circuit DRIVE.

The first filler cell F01 may be inserted between the first to third PMOS transistors P01 to P03 formed by the common platform library and the first to sixth NMOS transistors N01 to N06 formed according to an exemplary embodiment of the present invention an accordingly, the layout design rule error may be prevented.

Further, the second filler cell F02 may be inserted between the drive circuit DRIVE formed by the common platform library and the first to sixth NMOS transistors N01 to N06 formed according to an exemplary embodiment of the present invention.

Figure 17:
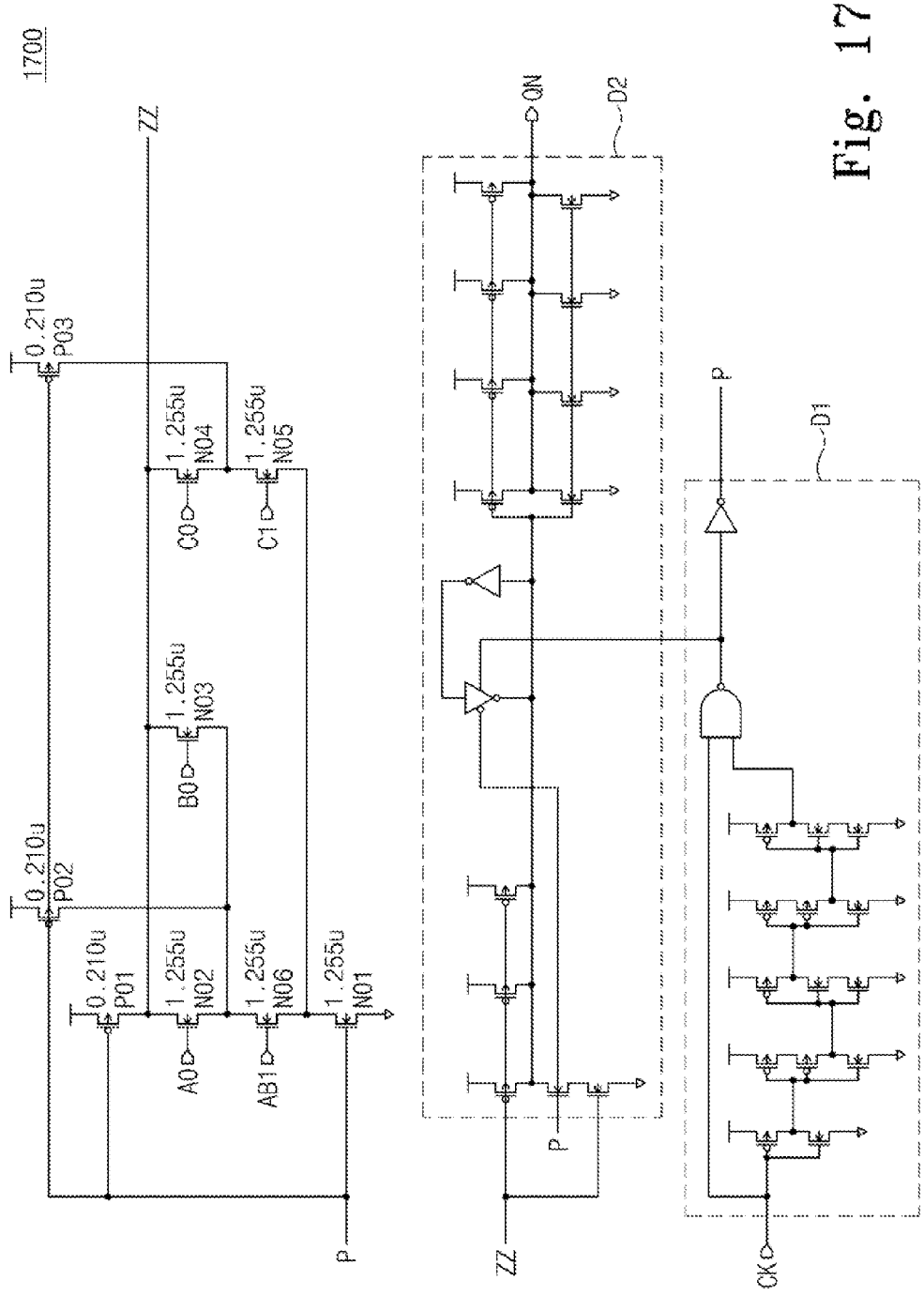
FIG. 17 is a circuit diagram showing a dynamic flip-flop according to an exemplary embodiment of the present invention.
Figure 18:
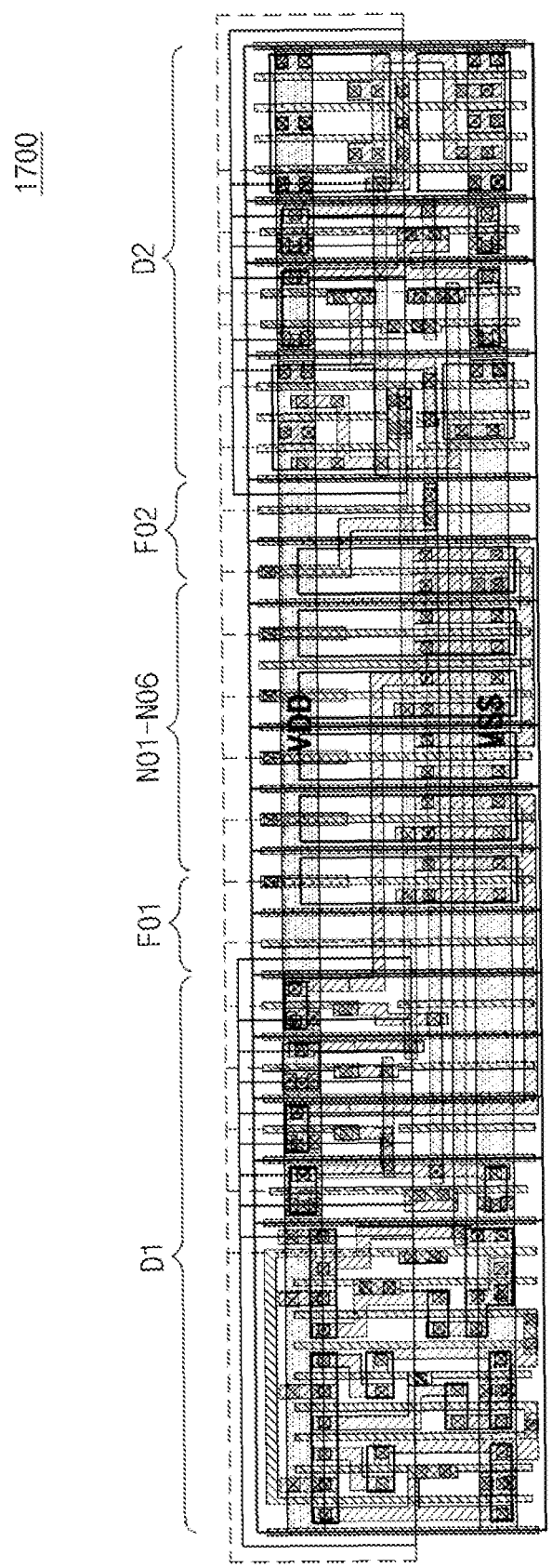
FIG. 18 is a layout diagram showing a dynamic flip-flop illustrated in FIG. 17.

FIG. 17 is a circuit diagram showing a dynamic flip-flop according to an exemplary embodiment of the present invention. FIG. 18 is a layout diagram showing a dynamic flip-flop illustrated in FIG. 17. In FIGS. 17 and 18, elements sharing labels with elements of FIGS. 15 and 16 may be similar.

Referring to FIG. 17, a dynamic flip-flop 1700 according to an exemplary embodiment of the present invention may include the first to third PMOS transistors P01 to P03 for pre-charge and the first NMOS transistor N01 for discharge controlled in common by a clock signal CK, the second to sixth NMOS transistors N02 to N06, the first logic part D1, and the second logic part D2.

A value determined via the second to sixth NMOS transistors N02 to N06 according to corresponding input signals A0, B0, C0, C1, and AB1 may be transferred to the second logic part D2, which drives an output terminal QN in response to the received value. The first logic part D1 may transfer the clock signal CK to the second logic part D2, the first to third PMOS transistors P01 to P03, and the first NMOS transistor N01.

Referring to FIGS. 17 and 18, the dynamic flip-flop 1700 illustrated in FIG. 17 may include the first to third PMOS transistors P01 to P03, the first to sixth NMOS transistors N01 to N06 having independent active regions, and the first and second filler cells F01 and F02, the first logic part D1, and the second logic part D2.

The first filler cell F01 may be inserted between the first logic part D1 formed by the common platform library and the first to sixth NMOS transistors N01 to N06 formed according to an exemplary embodiment of the present invention to prevent the layout design rule error.

The second filler cell F02 may be inserted between the second logic part D2 formed by the common platform library and the first to sixth NMOS transistors N01 to N06 formed according to an exemplary embodiment of the present invention to prevent the layout design rule error.

In accordance with exemplary embodiments of the present invention, it is possible to reduce a chip size by applying optimized dynamic standard cell libraries to the design of dynamic logic circuits.

The above-disclosed subject matter is to be considered illustrative, and not restrictive.

What is claimed is:

1. A dynamic logic circuit comprising:
   a first region including a plurality of PMOS transistors;
   a second region adjacent to the first region and including a plurality of NMOS transistors; and
   a filler cell that prevents a design rule error when a common platform library cell is adjacent to one side of one of the plurality of NMOS transistors,
   wherein at least one of the plurality of NMOS transistors is connected with at least one of the plurality of PMOS transistors, and
   wherein a channel size of each of the plurality of NMOS transistors is greater than a channel size of each of the plurality of PMOS transistors.

2. The dynamic logic circuit of claim 1, wherein each of the plurality of PMOS transistors has an active region and each of the active regions of the plurality of PMOS transistors are independent of one another.

3. The dynamic logic circuit of claim 1, wherein each of the plurality of NMOS transistors has an active region and each of the active regions of the plurality of NMOS transistors are independent of one another.

4. The dynamic logic circuit of claim 1, wherein the at least one of the plurality of NMOS transistors includes an N-well region that prevents a design rule error.

5. The dynamic logic circuit of claim 1, wherein the filler cell has a cell size equal to a cell size of each of the plurality of NMOS transistors, the filler cell has a gate size equal to a gate size of each of the plurality of NMOS transistors and wherein the filler cell does not contain an active region.

6. The dynamic logic circuit of claim 1, wherein each of the plurality of PMOS transistors has an N-well region, and a boron monophosphide (BP) layer within the first region.

7. The dynamic logic circuit of claim 1, wherein each of the plurality of PMOS transistors is controlled by a common clock signal and an operating voltage is provided to each of the plurality of NMOS transistors.

8. The dynamic logic circuit of claim 1, wherein the filler cell is inserted between the one of the plurality of NMOS transistors and the common platform library cell to provide an interface.

9. An inverter comprising:
   an N-well region including a PMOS region with at least one PMOS transistor formed thereon;
   a P-well region including an NMOS region with at least one NMOS transistor formed thereon;
   a boron monophosphide (BP) layer within the PMOS region;
   a gate connecting a gate terminal of the at least one PMOS transistor with a gate terminal of the at least one NMOS transistor; and
   a filler cell that prevents a design rule error when a common platform library cell is adjacent to one side of the at least one NMOS transistor,
   wherein the at least one NMOS transistor and the at least one PMOS transistor each include a source terminal and a drain terminal and the source terminal of the at least one PMOS transistor is connected to a first metal line having a power supply voltage VDD, the source terminal of the at least one NMOS transistor is connected with a second metal line having a ground voltage VSS, and the drain terminal of the at least one PMOS transistor is connected to the drain terminal of the at least one NMOS transistor with a third metal line.

10. The inverter of claim 9 wherein there is a greater number of NMOS transistors than PMOS transistors and at least one of the one or more NMOS transistors are formed in a region of the inverter where at least one of the PMOS transistors is formed.

11. An inverter comprising:
    an N-well region including a PMOS region with at least one PMOS transistor formed thereon;
    a P-well region including an NMOS region with at least one NMOS transistor formed thereon;
    a gate connecting a gate terminal of the at least one PMOS transistor with a gate terminal of the at least one NMOS transistor; and
    a filler cell that prevents a design rule error when a common platform library cell is adjacent to one side of the at least one NMOS transistor,
    wherein the at least one NMOS transistor and the at least one PMOS transistor each include a source terminal and a drain terminal and the source terminal of the at least one PMOS transistor is connected to a first metal line having a power supply voltage VDD, the source terminal of the at least one NMOS transistor is connected with a second metal line having a ground voltage VSS, and the drain terminal of the at least one PMOS transistor is connected to the drain terminal of the at least one NMOS transistor with a third metal line, and
    wherein the filler cell is inserted between the at least one NMOS transistor and the common platform library cell to provide an interface, and
    wherein a number of PMOS transistors is less than a number of NMOS transistors, and a gate size of each of the NMOS transistors is larger than a gate size of each of the PMOS transistors.

12. The inverter of claim 9, wherein each of the at least one PMOS transistor has an active region and each of the active regions of the at least one of PMOS transistor are independent of one another.

13. The inverter of claim 9, wherein each of the at least one NMOS transistor has an active region and each of the active regions of the at least one NMOS transistor are independent of one another.

14. The inverter of claim 9, wherein the filler cell has a cell size equal to a cell size of the NMOS transistor, the filler cell has a gate size equal to a gate size of the NMOS transistor and wherein the filler cell does not contain an active region.

15. The inverter of claim 9, wherein the PMOS transistor is controlled by a clock signal and an operating voltage is provided to the NMOS transistor.

16. The dynamic logic circuit of claim 9, wherein the filler cell is inserted between the one of the plurality of NMOS transistors and the common platform library cell to provide an interface.

17. An inverter comprising:
    an N-well region including a PMOS region with at least one PMOS transistor formed thereon;
    a P-well region including an NMOS region with at least one NMOS transistor formed thereon;
    a boron monophosphide (BP) layer within the at least one PMOS region; and a gate connecting a gate terminal of the at least one PMOS transistor with a gate terminal of the at least one NMOS transistor, wherein the at least one NMOS transistor and the at least one PMOS transistor each include a source terminal and a drain terminal and the source terminal of the at least one PMOS transistor is connected to a first metal line having a power supply voltage VDD, the source terminal of the at least one NMOS transistor is connected with a second metal line having a ground voltage VSS, and the drain terminal of the at least one PMOS transistor is connected to the drain terminal of the at least one NMOS transistor with a third metal line, and wherein the gate of the at least one PMOS transistor is larger than the gate of the at least one NMOS transistor.

* * * * *